(12) United States Patent
Morioka

(10) Patent No.: US 7,670,759 B2
(45) Date of Patent: Mar. 2, 2010

(54) MICRO PATTERN FORMING METHOD AND SEMICONDUCTOR DEVICE MANUFACTURING METHOD

(75) Inventor: Hiroshi Morioka, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 110 days.

(21) Appl. No.: 10/692,722

(22) Filed: Oct. 27, 2003

(65) Prior Publication Data

US 2004/0157169 A1 Aug. 12, 2004

(30) Foreign Application Priority Data

Oct. 28, 2002 (JP) .............................. 2002-312941

(51) Int. Cl.
*G03F 1/00* (2006.01)
*B44C 1/22* (2006.01)

(52) U.S. Cl. ........................ 430/325; 430/322; 430/323; 216/66

(58) Field of Classification Search ................ None
See application file for complete search history.

(56) References Cited

U.S. PATENT DOCUMENTS

| 6,110,826 | A | * | 8/2000 | Lou et al. ................... 438/674 |
| 6,187,688 | B1 | | 2/2001 | Ohkuni et al. |
| 6,579,808 | B2 | * | 6/2003 | Cho et al. .................... 438/725 |
| 2001/0036732 | A1 | | 11/2001 | Yoshida et al. |
| 2002/0006730 | A1 | | 1/2002 | Ishibashi |
| 2002/0061654 | A1 | * | 5/2002 | Kanegae et al. ............. 438/710 |
| 2003/0134231 | A1 | * | 7/2003 | Tsai et al. ................... 430/312 |

FOREIGN PATENT DOCUMENTS

| JP | 10-98029 | 4/1998 |
| JP | 2928391 | 5/1999 |
| JP | 2971443 | 8/1999 |
| JP | 2001-196355 | 7/2001 |
| JP | 2001-308076 | 11/2001 |
| JP | 2002-009056 A | 1/2002 |
| JP | 2002-083804 | 3/2002 |
| WO | WO 02/080234 A2 | 10/2002 |

OTHER PUBLICATIONS

Japanese Office Action dated Jan. 23, 2007 (mailing date), issued in corresponding Japanese Patent Application No. 2002-312941.
Japanese Office Action dated Jul. 24, 2007, issued in corresponding Japanese Application No. 2002-312941.

* cited by examiner

*Primary Examiner*—Daborah Chacko Davis
(74) *Attorney, Agent, or Firm*—Westerman, Hattori, Daniels & Adrian, LLP

(57) ABSTRACT

Photosensitive resist material is coated on a substrate and exposed and developed to form a resist pattern. The surface layer of sidewalls and a top wall of the resist pattern is etched by plasma of a mixture gas of a first gas and an $SO_2$ gas, the first gas being at least one gas selected from a group consisting of He, Ne, Ar, Xe, Kr, CO, $CO_2$ and $N_2$. Resist pattern deformation and pattern collapse can be prevented while the resist pattern shrinks.

19 Claims, 7 Drawing Sheets

MICRO PATTERN FORMING METHOD AND SEMICONDUCTOR DEVICE MANUFACTURING METHOD

CROSS REFERENCE TO RELATED APPLICATION

This application is based on and claims priority of Japanese Patent Application No. 2002-312941 filed on Oct. 28, 2002, the entire contents of which are incorporated herein by reference.

BACKGROUND OF THE INVENTION

A). Field of the Invention

The present invention relates generally to a fine pattern forming method and a semiconductor device manufacturing method, and more particularly to a method of forming a micro pattern by exposing and developing a photosensitive resist film and a method of manufacturing a semiconductor device using micro patterns.

B) Description of the Related Art

Japanese Patent Laid-open Publication HEI-13-196355 discloses the technique of exposing and developing a resist film formed on an antireflection film made of organic material and thereafter etching the antireflection film by using mixture gas of $Cl_2$, HBr, $O_2$ and Ar. Japanese Patent Laid-open Publication HEI-10-98029 discloses a method of etching an antireflection film by using mixture gas of HBr and $O_2$. While the antireflection film is etched, the surface layer of a resist pattern is also etched and the pattern shrinks. It is therefore possible to form a pattern finer than the resist pattern immediately after development.

With these methods, however, deformation of a protective film attached on the sidewalls of a resist pattern applies stress to the resist pattern or the resist resin is chemically reacted with halogen-based gas. Such stress to and chemical reaction with the resist pattern are not actualized if the pattern size is large. If the minimum size of a resist pattern after size reduction is in the order of 100 nm or smaller, a resist pattern itself may be deformed or fell out.

Japanese Patent Publication No. 2928391 discloses the technique of etching an organic antireflection film under a resist pattern by using mixture gas of $Cl_2$, $SO_2$ and $O_2$ or mixture gas of $SO_2$ and $O_2$. If etching gas contains halogen gas such as $Cl_2$, a resist pattern is inevitably damaged by chemical reaction.

Other related arts are disclosed in Japanese Patent Publication No. 2971443.

SUMMARY OF THE INVENTION

An object of this invention is to provide a method of forming a micro resist pattern capable of preventing deformation and collapse of the pattern while it shrinks (is reduced in size).

Another object of the invention is to provide a method of manufacturing a semiconductor device using such micro patterns.

According to one aspect of the present invention, there is provided a method of forming a micro pattern comprising steps of: (a) coating photosensitive resist material on a substrate and exposing and developing the photosensitive resist material to form a resist pattern; and (b) etching a surface layer of sidewalls and a top wall of the resist pattern by plasma of a mixture gas of a first gas and an $SO_2$ gas, the first gas comprising at least one gas selected from the group consisting of He, Ne, Ar, Xe, Kr, CO, $CO_2$ and $N_2$.

According to another aspect of the present invention, there is provided a method of manufacturing a semiconductor device comprising steps of: patterning an organic antireflection film by using as a mask a micro pattern formed by the micro pattern forming method; etching a first film formed under the organic antireflection film by using as a mask the resist pattern and organic antireflection film.

Instead of $SO_2$ gas used by the etching step, another gas may be used which forms sulfur containing polymer by itself or by reacting with the photosensitive resist material.

By adding He or the like to etching gas, it becomes possible to suppress excessive formation of a protective film through reaction of $SO_2$ gas or the like with the photosensitive resist material and to prevent resist pattern deformation and pattern collapse. A variation in trimming amounts of a resist pattern can be made small.

DESCRIPTION OF THE PREFERRED EMBODIMENTS

With reference to FIGS. 1A to 1H, description will be given on a semiconductor device manufacture method according to an embodiment of the invention.

Figure 1A:
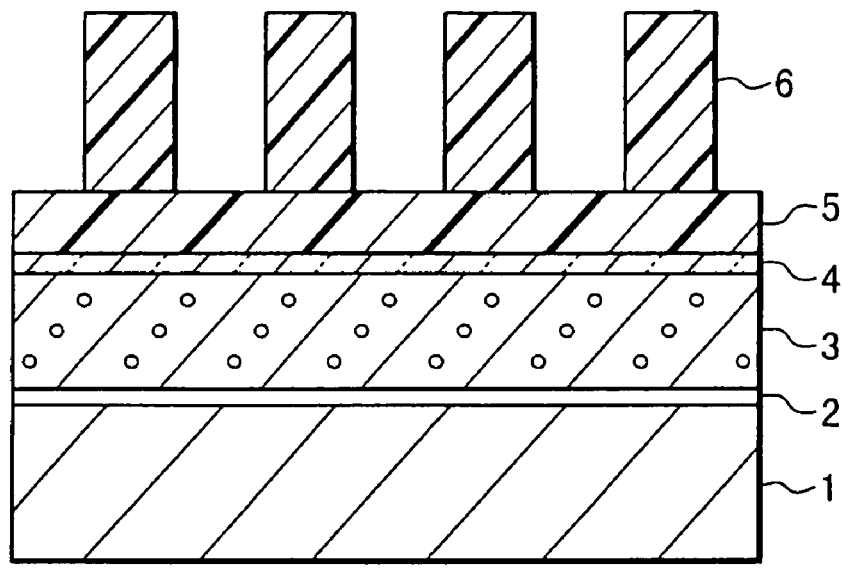
FIGS. 1A to 1H are cross sectional views of a substrate illustrating a semiconductor device manufacturing method according to an embodiment of the invention.

The processes up to the state shown in FIG. 1A will be described. An element separation insulating film is formed in the surface layer of a silicon substrate 1 to define active regions. Ions necessary for well formation and threshold value control are implanted into the surface layers of the active regions. FIG. 1A is a cross sectional view of the substrate in an active region.

On the surface of the silicon substrate 1, a gate insulating film 2 is formed which is made of silicon oxynitride and has a thickness of about 1 nm. For example, the gate insulating film 2 is formed by thermally oxidizing the substrate surface to form a silicon oxide film and thereafter nitriding the silicon oxide film.

On the gate insulating film 2, a gate electrode layer 3 is formed by CVD, which is made of polysilicon and has a thickness of about 110 nm. On the gate electrode layer 3, a hard mask layer 4 of silicon oxide and about 30 nm in thickness is formed by CVD using tetraethylorthosilicate (TEOS).

On the hard mask layer 4, an organic antireflection film 5 is formed which is made of organic material capable of absorbing light in the wavelength range of an ArF laser beam and has a thickness of 82 nm. For example, the organic antireflection film 5 can be formed by spin coating ARC39 manufactured by NISSAN CHEMICAL INDUSTRIES, LTD.

On the organic antireflection film 5, a resist film sensitive to ArF laser is formed to a thickness of 300 nm. The resist material may be PAR700 manufactured by Sumitomo Chemical Company, Ltd. This resist film is exposed to ArF laser and developed to form a resist pattern 6. For example, the resist pattern 6 is a line-and-space pattern (stripe pattern) having a plurality of straight line patterns having a width of 80 nm and disposed at a pitch of 260 nm.

Figure 1B:
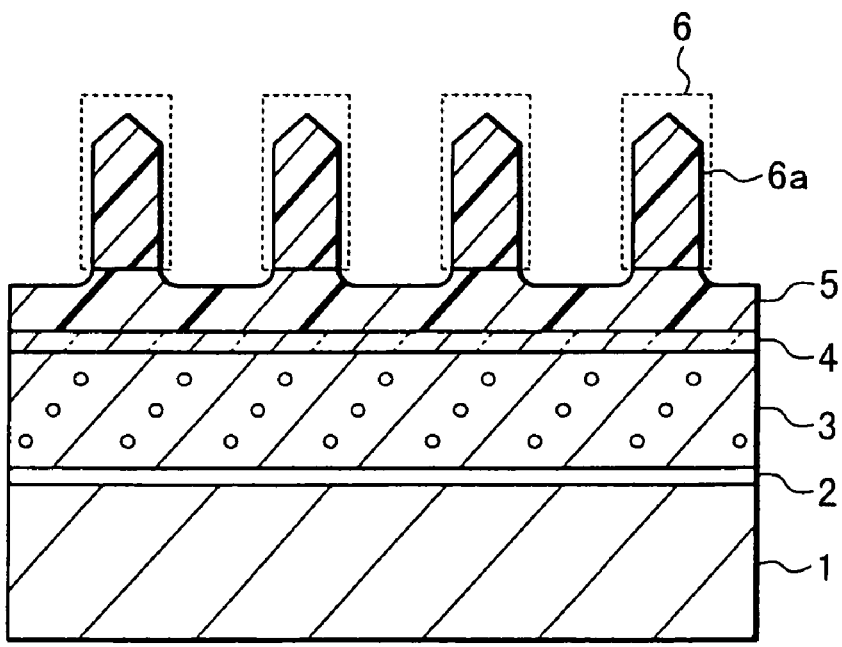

As shown in FIG. 1B, the surface layer of the resist pattern 6 is etched by using mixture plasma gas of He, $SO_2$ and $O_2$ to shrink (reduce the size of) the resist pattern. A resist pattern 6a is therefore left, being reduced in size from that of the resist pattern 6. At this time, the exposed surface of the organic antireflection film 5 is also etched.

This etching was performed by using an inductive coupled plasma (ICP) system under the following conditions. The flow rates of He, $SO_2$ and $O_2$ were set to 60 sccm, 10 sccm and 20 sccm, respectively, the pressure in the plasma chamber was set to 0.67 Pa (5 mTorr) and the substrate temperature was set to 20° C. An RF power for plasma generation was set to 300 W and a bias RF power supplied to an electrode which held the substrate was set to 25 W. Both the RF powers had a frequency of 13.56 MHz.

Figure 1C:
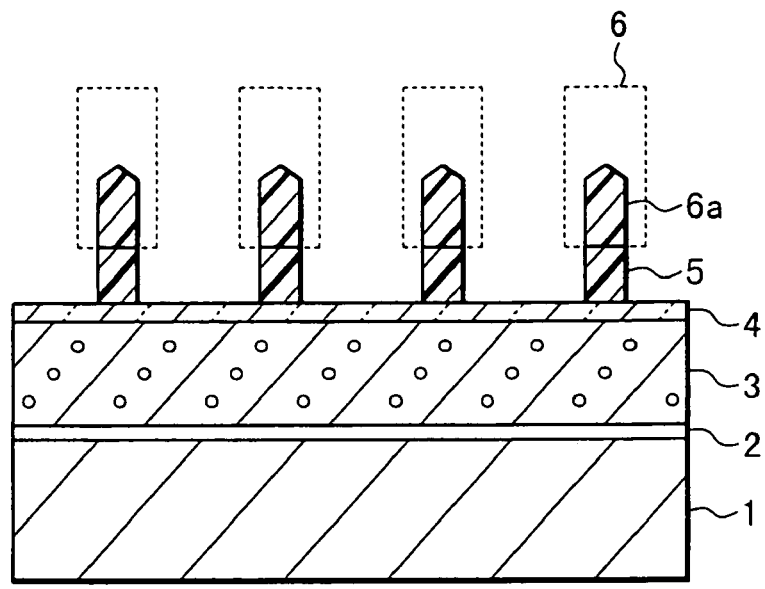

As shown in FIG. 1C, the etching progresses further to the bottom of the organic antireflection film 5. During this etching period, the resist pattern 6a further shrinks and its width becomes about 45 nm. The width of 80 nm of the initial resist pattern 6a can thus be thinned (made narrower) to 45 nm. The thinned amount of the initial resist pattern 6a is called a trimming amount. In this embodiment, the trimming amount is 35 nm.

After the whole thickness of the organic antireflection film 5 is etched, 20% over-etching is performed. This 20% over-etching means that extra etching is performed for the period of 20% of the period necessary for etching the whole thickness of the organic antireflection film 5. This over-etching can prevent the generation of residues to be caused by irregularity of the thickness of the organic antireflection film 5.

Figure 1D:
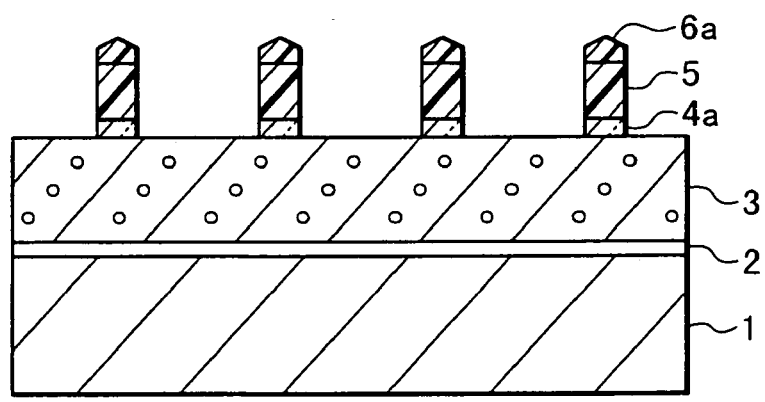

As shown in FIG. 1D, by using the resist pattern 6a and organic antireflection film pattern 5 as a mask, the hard mask layer 4 is etched. For example, the hard mask layer 4 can be dry-etched by using inductive coupled plasma of $CF_4$ gas under the following conditions. An RF power for plasma generation is set to 300 W, an RF power to be applied to an electrode which supports the substrate is set to 25 W, a pressure in the plasma chamber is set to about 0.67 Pa (5 mTorr), a $CF_4$ gas flow rate is set to 100 sccm, and a substrate temperature is set to 20° C. After the hard mask layer 4 is patterned, a hard mask pattern 4a is left.

Next, by using the resist pattern 6a, antireflection film pattern 5 and hard mask pattern 4a as a mask, the gate electrode layer 3 is dry-etched by using inductive coupled plasma of mixed gas of $Cl_2$, HBr, $CF_4$ and $O_2$, for example under the following conditions. An RF power for plasma generation is set to 500 W, an RF power to be applied to an electrode which supports the substrate is set to 34 W, a pressure in the plasma chamber is set to about 1.6 Pa (12 mTorr), the gas flow rates of $Cl_2$, HBr, $CF_4$ and $O_2$ are set to 100 sccm, 250 sccm, 150 sccm and 10 sccm, respectively, and a substrate temperature is set to 60° C.

Figure 1E:
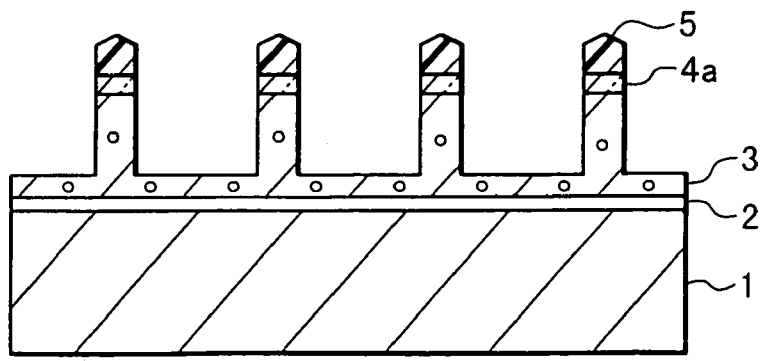

FIG. 1E is a cross sectional view showing the substrate after etching for 21 seconds under the above-described conditions. The gate electrode layer 3 is etched to an intermediate depth, the resist pattern 6a is lost and the surface layer of the antireflection film pattern 5 is etched.

Starting from this state, the etching conditions are changed as in the following to further etch the gate electrode layer 3. An RF power for plasma generation is set to 350 W, an RF power to be applied to an electrode which supports the substrate is set to 18 W, a pressure in the plasma chamber is set to about 0.8 Pa (6 mTorr), the gas flow rates of HBr and $O_2$ are set to 180 sccm and 5 sccm, respectively, and a substrate temperature is set to 60° C.

Figure 1F:
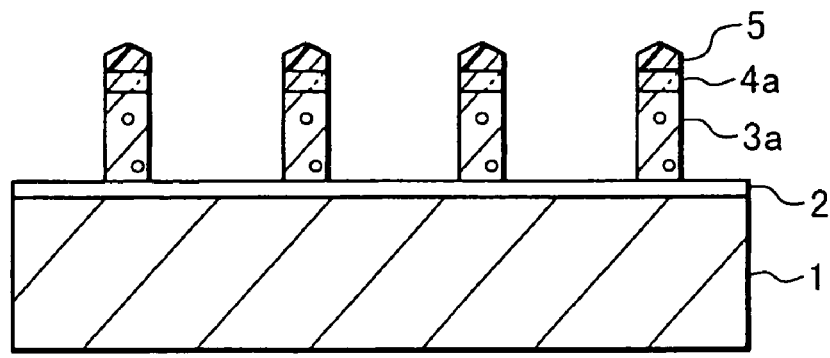

FIG. 1F is a cross sectional view showing the substrate after etching for 21 seconds under the above-described conditions. The etching advances to the bottom of the gate electrode layer 3 and gate electrodes 3a of polysilicon are left. In this case, even if the organic antireflection film 5 is completely removed, the hard mask pattern 4a is left so that the gate electrodes 3a having a desired shape can be formed.

Over-etching is further performed under the following conditions. An RF power for plasma generation is set to 350 W, an RF power to be applied to an electrode which supports the substrate is set to 65 W, a pressure in the plasma chamber is set to about 11 Pa (80 mtorr), the gas flow rates of HBr, He and $O_2$ are set to 150 sccm, 150 sccm and 5 sccm, respectively, and a substrate temperature is set to 60° C.

Figure 1G:
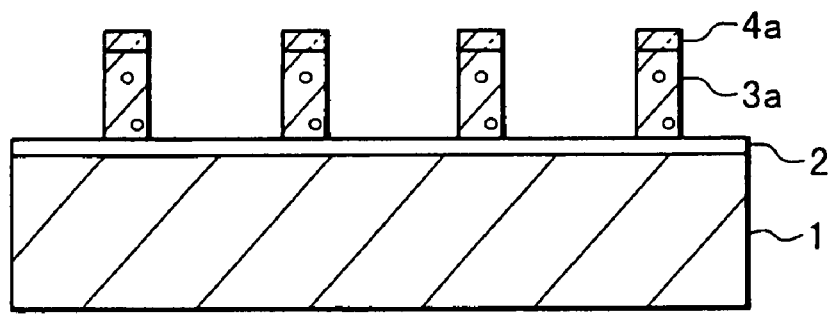

As shown in FIG. 1G, the antireflection film pattern 5 shown in 1F is removed by ashing using oxygen plasma. A wet post-process is then performed including, for example, a dilute hydrofluoric acid process and a sulfuric acid hydrogen peroxide process.

Figure 1H:
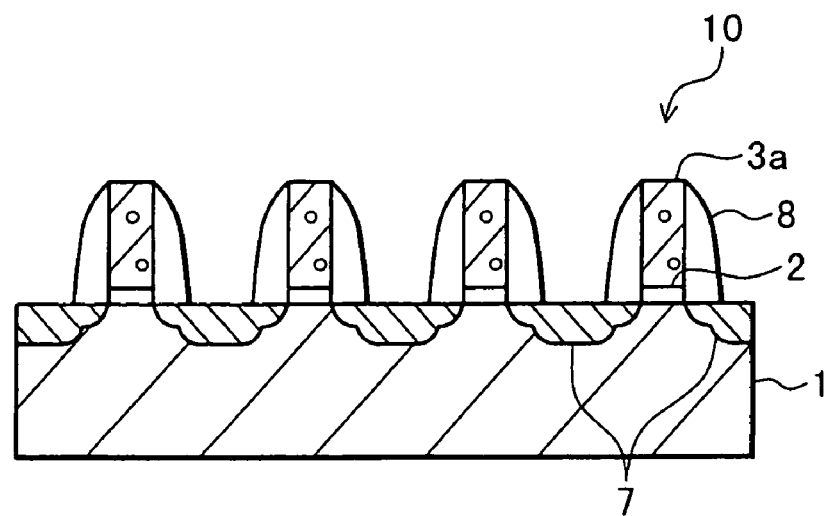

As shown in FIG. 1H, the hard mask pattern 4a on the gate electrodes 3a and the exposed gate insulating film 2 respectively shown in FIG. 1G are removed by using hydrofluoric acid. Ions are implanted into extension regions of LDD structures, sidewall spacers 8 are formed, and ions are implanted into source and drain regions 7 to form MISFETs 10.

In this embodiment, the size reduction processes for the resist pattern 6 shown in FIGS. 1B and 1C use, as the etching gas, $SO_2$ gas and $O_2$ gas added with He gas. Addition of He gas prevents pattern deformation and resist pattern collapse and allows the resist pattern to stably shrink.

Instead of He gas, rare gas of Ne, Ar, Xe, Kr or the like may be used. If rare gas having a large atomic number is used, the temperature of electrons in plasma can be lowered and excessive dissociation of oxygen can be suppressed. It is therefore possible to suppress the generation of oxygen radicals and improve the controllability of the trimming amount of a resist pattern. In place of rare gas, CO, $CO_2$ or $N_2$ gas may be used:

When a ratio of the flow rate of He gas to the total flow rate of the etching gas was set to 40%, the trimming amounts of resist patterns formed at five positions on the same substrate were 11.0 nm, 9.1 nm, 12.9 nm, 6.4 nm and 16.4 nm. An average trimming amount is 11.2 nm and 3σ is 11.4 nm. When the flow rate ratio of He gas was set to 75%, the trimming amounts of resist patterns formed at five positions on the same substrate were 11.6 nm, 10.5 nm, 12.8 nm, 10.4 nm and 12.0 nm. An average trimming amount is 11.5 nm and 3σ is 3.1 nm.

A variation in trimming amounts can be made small by setting a large rare gas flow rate. This may be ascribed to that excessive attachment of a protective film to be caused by $SO_2$ gas can be suppressed. In order to enhance the effects of reducing the trimming amount, it is preferable that a ratio of the flow rate of rare gas to the total flow rate of the etching gas is set to 40% or larger. Since excessive attachment of a protective film to be caused by $SO_2$ gas can be suppressed, it is possible to prevent resist pattern deformation and pattern collapse to be caused by a deformation of a protective film.

The etching gas used in the first embodiment does not contain halogen-based gas. It is therefore possible to prevent resist pattern deformation and pattern collapse to be caused by chemical reaction with halogen-based gas.

Figure 2A:
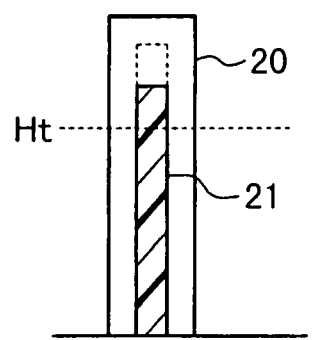
FIGS. 2A to 2D are cross sectional views and plan views showing the shapes of a resist pattern before and after size reduction.

FIG. 2A is a cross sectional view of a resist pattern 21 which shrinks through the embodiment method, being compared with a resist pattern 20 before shrinking. The sidewalls of the resist pattern 20 before shrinking are retracted and become thin, and etching advances also from the upper surface to lower the height of the resist pattern. The lowered resist pattern 21 is higher than a height Ht necessary for patterning the underlying layer.

Figure 2B:
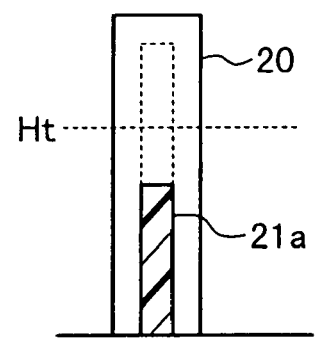

FIG. 2B is a cross sectional view of a resist pattern before and after size reduction by the conventional method. An etching amount from the upper surface of a resist pattern 20 is large. As the resist pattern is thinned, the etching amount from the upper surface becomes large. A resist pattern 21a after size reduction cannot maintain in some cases the necessary height Ht.

By adding rare gas or the like to etching gas as in the first embodiment, the etching rate of a resist pattern can be controlled easily so that the resist pattern can be easily thinned and the necessary height can be maintained.

Figure 2C:
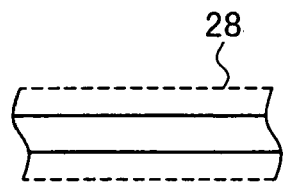
Figure 2C:
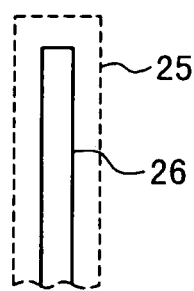
Figure 2D:
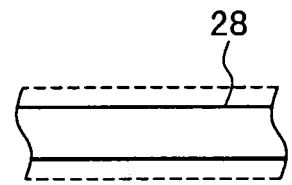
Figure 2D:
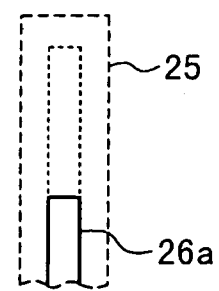

FIG. 2C is a plan view of a resist pattern 26 which shrinks through the embodiment method, being compared with a resist pattern 25 before size reduction. The resist pattern is thinned by size reduction and the top thereof is retracted. FIG. 2D is a plan view of a resist pattern 25 before size reduction by the conventional method and a resist pattern 26a after size reduction. With the conventional method, the top of the resist pattern has a large retraction amount. The top of the resist pattern 26a after size reduction cannot be positioned near to a resist pattern 28 disposed over the resist pattern 26a.

Since the retraction amount of the top is small in the embodiment, the top of the resist pattern 26 can be positioned nearer to the resist pattern 28 than the conventional method.

Figure 3:
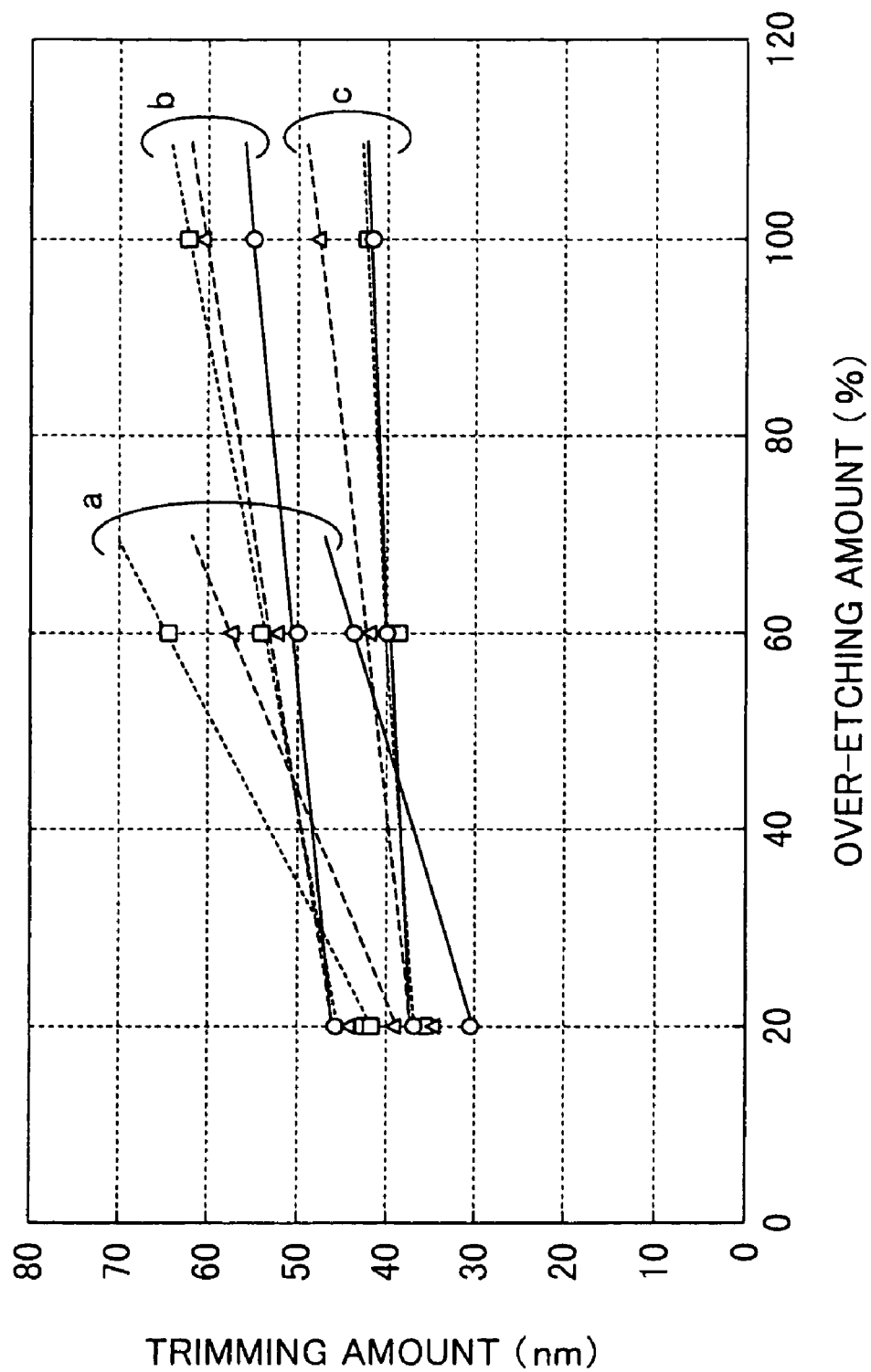
FIG. 3 is a graph showing the relation between an overetching amount and a trimming amount, by using as a parameter the kind of etching gas.

With reference to FIG. 3, the influence of flow rate ratios of He, $O_2$ and $SO_2$ gases upon the trimming amount will be described. A plurality of samples of shrunk resist patterns were formed by changing the flow rate ratios of He, $O_2$ and $SO_2$ gases and the over-etching amount, and the trimming amount and the top retraction amount (line-end shortening amount) of each resist pattern were measured.

The abscissa of the graph shown in FIG. 3 represents an over-etching amount in the unit of "%" and the ordinate represents a trimming amount and a top retraction amount in the unit of "nm". A solid line in FIG. 3 indicates a trimming amount of an isolated resist pattern, a broken line indicates a trimming amount of a resist pattern having a line-and-space pattern having a width of 80 nm and a pitch of 0.26 μm, and a dot line indicates a top retraction amount of a resist pattern having a width of 80 nm. A line group a shows a trimming amount of each sample being shrunk at the He and $O_2$ flow rates of 60 sccm and 2 sccm, respectively, without addition of $SO_2$. A line group b shows a trimming amount of each sample being shrunk at the He, $O_2$ and $SO_2$ flow rates of 60 sccm, 20 sccm and 5 sccm, respectively. A line group c shows a trimming amount of each sample being shrunk at the He, $O_2$ and $SO_2$ flow rates of 60 sccm, 20 sccm and 10 sccm, respectively. Circle, triangle and square symbols added to each line indicate average values of trimming amount measurement results of a plurality of resist patterns.

If $SO_2$ is added to etching gas, a change in the trimming amount becomes small even if the over-etching amount is increased. By adding $SO_2$, the over-etching can be performed while the trimming amount is maintained almost constant. It can be understood that by adding $SO_2$, the dependency of the trimming amount upon a pattern density lowers. It is therefore possible to shrink an isolated pattern and a line-and-space pattern almost uniformly.

If $SO_2$ is not added, the retraction amount of a pattern top is larger than the trimming amount. If $SO_2$ is added, the retraction amount of a pattern top becomes as small a degree as that of the trimming amount.

Figure 4:
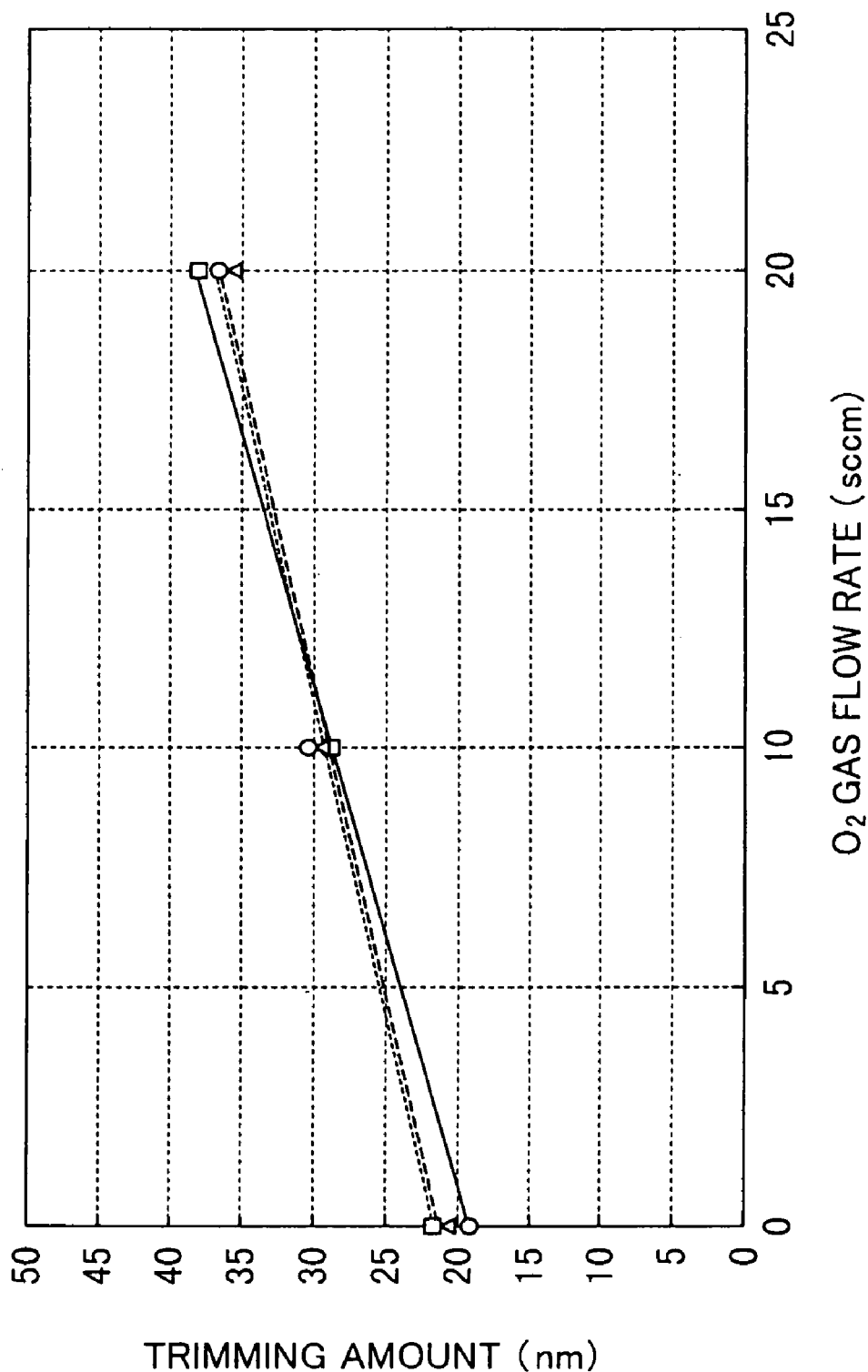
FIG. 4 is a graph showing the relation between an $O_2$ gas flow rate and a trimming amount.

FIG. 4 is a graph showing the relation between an $O_2$ gas flow rate and a trimming amount. The flow rates of He and $SO_2$ were set to 60 sccm and 10 sccm, respectively, and the over-etching amount was set to 20%. A solid line indicates a trimming amount of an isolated resist pattern, a broken line indicates a trimming amount of a resist pattern having a line-and-space pattern having a width of 80 nm and a pitch of 0.26 μm, and a dot line indicates a top retraction amount of a resist pattern having a width of 80 nm. Circle, triangle and square symbols added to each line indicate average values of trimming amount measurement results of a plurality of resist patterns. As the $O_2$ gas flow rate is increased, the trimming amount and the retraction amount of a resist pattern top increase.

Figure 5:
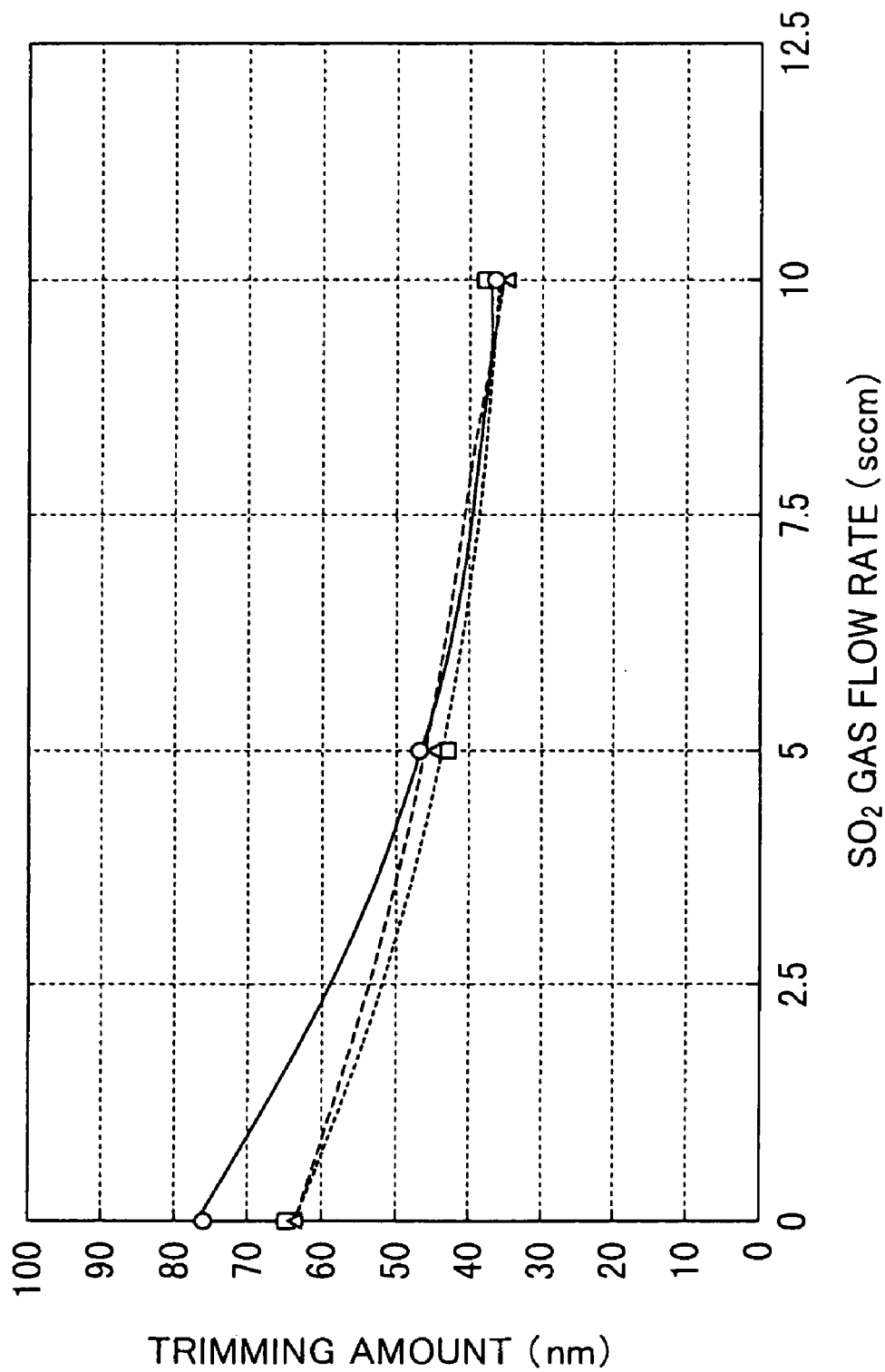
FIG. 5 is a graph showing the relation between an $SO_2$ gas flow rate and a trimming amount.

FIG. 5 is a graph showing the relation between an $SO_2$ gas flow rate and a trimming amount. The flow rates of He and $O_2$ were set to 60 sccm and 20 sccm, respectively, and the over-etching amount was set to 20%. A solid line, a broken line and a dot line indicate the same patterns as those indicated by the solid, broken and dot lines shown in FIG. 4. Circle, triangle and square symbols added to each line indicate average values of trimming amount measurement results of a plurality of resist patterns. As the $SO_2$ gas flow rate is increased, the trimming amount and the retraction amount of a resist pattern top decrease.

As $SO_2$ gas is added to etching gas, a sulfur containing polymer layer is formed on the surface of a resist pattern. This polymer layer is considered lowering the etching speed of a resist pattern. In order to efficiently form a sulfur containing polymer layer, it is preferable that the substrate temperature is set to 40° C. or lower when a resist pattern shrinks. Instead of $SO_2$, other gases may be used which can form a sulfur containing polymer layer. Such gases may be carbonyl sulfide, hydrogen sulfide or the like.

As seen from FIGS. 4 and 5, by changing the flow rate ratio between $O_2$ and $SO_2$, the trimming amount can be controlled.

In the process shown in FIG. 1C, after etching is performed for a period necessary for etching the organic antireflection film 5 to the bottom thereof, the ratio of an $SO_2$ gas flow rate to the total etching gas flow rate is increased so that the over-etching of the organic antireflection film 5 can be performed while suppressing an increase in the trimming amount. It is therefore possible to form a steeply rising sidewall of the organic antireflection film 5.

The present invention has been described in connection with the preferred embodiments. The invention is not limited only to the above embodiments. It is apparent that various modifications, improvements, combinations, and the like can be made by those skilled in the art.

What we claim are:

1. A method of forming a micro pattern comprising steps of:
   (a) coating photosensitive resist material over a substrate and exposing and developing the photosensitive resist material to form a resist pattern;
   (b) etching a surface layer of sidewalls and a top wall of the resist pattern by plasma of a mixture gas comprising a first gas and an $SO_2$ gas, the first gas comprising at least one gas selected from the group consisting of He, Ne, Ar, Xe, Kr, CO, $CO_2$ and $N_2$;
   wherein in the step (b), a flow rate of the first gas is equal to or larger than 40% of a flow rate of the mixture gas;
   wherein the substrate has an antireflection film made of organic substance and formed over an underlying surface;

in the step (b), the surface layer of the resist pattern is etched, and by using the resist pattern, whose surface layer is being etched, as a mask, the antireflection film is etched to be patterned; and wherein a partial area of the underlying surface is covered with the antireflection film patterned in the step (b), and the underlying surface exposed and not covered with the antireflection film patterned in the step (b) is larger than a surface of the antireflection film exposed and not covered with the resist pattern after the step (a) and before the step (b).

2. A method of forming a micro pattern according to claim 1, wherein the mixture gas additionally comprises an $O_2$ gas.

3. A method of forming a micro pattern according to claim 2, wherein:

the substrate has an antireflection film made of organic substance and formed over an underlying surface; and in the step (b), the surface layer of the resist pattern is etched, and by using the resist pattern as a mask, the antireflection film is etched.

4. A method of forming a micro pattern according to claim 1, wherein in the step (b), the etching is performed in a state that a temperature of the substrate is maintained at 40° C. or lower.

5. A method of forming a micro pattern according to claim 1, wherein the mixture gas comprises an $O_2$ gas.

6. A method of forming a micro pattern according to claim 5, wherein the step (b) includes a step of increasing a ratio of a flow rate of the $SO_2$ gas to a flow rate of the $O_2$ gas during the etching.

7. A method of forming a micro pattern according to claim 6, wherein in the step (b), the flow rate ratio of the $SO_2$ gas is increased when the time necessary for etching a whole thickness of the antireflection film lapses.

8. A method of forming a micro pattern according to claim 1, wherein said photosensitive resist material and said antireflection film are over-etched after a whole thickness of the antireflection film is etched.

9. A method of forming a micro pattern according to claim 1, wherein the etching of the resist pattern reduces the width of the resist pattern.

10. A method of manufacturing a semiconductor device comprising steps of:

(i) forming a first film over a semiconductor substrate;

(j) forming an antireflection film made of organic substance over the first film;

(k) forming a resist film made of photosensitive resist material over the antireflection film;

(l) exposing and developing the resist film to form a resist pattern;

(m) etching a surface layer of sidewalls and a top wall of the resist pattern by plasma of a mixture gas comprising a first gas and an $SO_2$ gas, the first gas comprising at least one gas selected from the group consisting of He, Ne, Ar, Xe, Kr, CO, $CO_2$ and $N_2$, and by using the resist pattern as a mask, patterning the antireflection film;

(n) etching the first film by using as a mask the resist pattern whose surface layer was etched and the patterned antireflection film;

(o) after etching the first film, removing the resist pattern and the antireflection film;

wherein in the step (m), a flow rate of the first gas is equal to or larger than 40% of a flow rate of the mixture gas; and wherein a surface of the first film exposed after the step (m) and before the step (n) is larger than the surface of the antireflection film exposed after the step (l) and before the step (m).

11. A method of manufacturing a semiconductor device according to claim 10, wherein:

the step (i) comprises a step of forming a second film over the semiconductor substrate and forming the first film over the second film; and the method further comprises a step of etching the second film by using the first film as a hard mask, after the step (n).

12. A method of forming a micro pattern according to claim 11, wherein a gate electrode is formed by etching the second film, and further comprising a step of implanting ions to form source and drain regions after the step (o).

13. A method of manufacturing a semiconductor device according to claim 10, wherein the mixture gas additionally comprises an $O_2$ gas.

14. A method of manufacturing a semiconductor device according to claim 10, wherein in the step (m), the etching is performed in a state that a temperature of the substrate is maintained at 40° C. or lower.

15. A method of manufacturing a semiconductor device according to claim 10, wherein the mixture gas comprises an $O_2$ gas and the step (m) comprises a step of increasing a ratio of a flow rate of the $SO_2$ gas to a flow rate of the $O_2$ gas during the etching.

16. A method of manufacturing a semiconductor device according to claim 15, wherein in the step (m), the flow rate ratio of the $SO_2$ gas is increased when the time necessary for etching a whole thickness of the antireflection film lapses.

17. A method of manufacturing a semiconductor device according to claim 10, wherein the etching of the resist pattern reduces the width of the resist pattern.

18. A method of manufacturing a semiconductor device comprising steps of:

forming a first film over a semiconductor substrate;

forming an antireflection film made of organic substance over the first film;

forming a resist film made of photosensitive resist material over the antireflection film;

exposing and developing the resist film to form a resist pattern;

etching a surface layer of sidewalls and a top wall of the resist pattern by plasma of a mixture gas comprising a first gas and a second gas, and patterning the antireflection film by using the resist pattern as a mask, the first gas comprising at least one gas selected from the group consisting of He, Ne, Ar, Xe, Kr, CO, $CO_2$ and $N_2$, and the second gas forming polymer that comprises sulfur;

etching the first film by using as a mask the resist pattern whose surface layer was etched and the patterned antireflection film;

after etching the first film, removing the resist pattern and the antireflection film; wherein the mixture gas further comprises an $O_2$ gas; and wherein a surface of the first film exposed after patterning the antireflection film and before removing the antireflection film is larger than the surface of the antireflection film exposed after developing the resist film and before patterning the antireflection film.

19. A method of manufacturing a semiconductor device according to claim 18, wherein the etching of the resist pattern reduces the width of the resist pattern.

* * * * *